United States Patent [19]

Takasugi

[11] 4,177,394
[45] Dec. 4, 1979

[54] COMPARATOR CIRCUIT HAVING MULTI-FUNCTIONS

[75] Inventor: Wasao Takasugi, Higashiyamato, Japan

[73] Assignee: Hitachi, Ltd., Japan

[21] Appl. No.: 828,672

[22] Filed: Aug. 29, 1977

[30] Foreign Application Priority Data

Sep. 1, 1976 [JP] Japan .................. 51-103645

[51] Int. Cl.² .............................................. H03K 5/20
[52] U.S. Cl. ..................................... 307/357; 307/360; 328/147
[58] Field of Search ........ 307/350, 355, 356, 360–364, 307/357; 328/146–147, 104, 154

[56] References Cited

U.S. PATENT DOCUMENTS 3,396,282  8/1968  Sheng et al. ..................... 307/362 X
3,456,127  7/1969  Gray et al. ........................... 307/357
3,633,045  1/1972  Nordling .......................... 307/360 X Primary Examiner—John Zazworsky
Attorney, Agent, or Firm—Craig and Antonelli

[57] ABSTRACT

A comparator circuit comprises first and second transistors having bases for receiving first and second input voltages, respectively, and a third transistor having a base for receiving a third input voltage to be compared with the first and second input voltages. The first, second and third transistors have respective emitters connected in common to a constant current source. Switching means is provided for selectively supplying a potential to the base of the first transistor thereby to turn off the same and is connected to a switch control means, to produce the collector potential of the third transistor or a corresponding potential.

13 Claims, 17 Drawing Figures

COMPARATOR CIRCUIT HAVING MULTI-FUNCTIONS

BACKGROUND OF THE INVENTION

1. Field of the Invention

The present invention relates to a comparator circuit which can be used in various control apparatus or the like.

2. Description of the Prior Art

In various control systems, such as temperature control devices or the like control apparatus, it is a rare case wherein only a single input signal, such as a sensor output signal, status signal or the like is provided as input to the control apparatus. In most cases, a plurality of such signals are inputted to the control apparatus. In this connection, a comparator circuit is very often used as the interface circuit between the input signal source, such as one or more sensors, and the control apparatus which usually includes one more logical circuits.

Such a comparator circuit is usually implemented in a differential circuit arrangement, as is shown in FIG. 1. More particularly, transistors 10 and 20 are connected in a differential configuration having input terminals 100 and 200, respectively, connected to the bases thereof, while the emitters of the transistors 10 and 20 are connected in common to a current source 1. A diode 2 and a transistor 3, both serving as load elements, are connected in the collector circuits of the transistors 10 and 20. Numeral 4 denotes an output amplifier and symbol +V denotes a potential source. With such an arrangement, the output signal of the comparator circuit available from the amplifier 4 will become logic "1" or "0" in dependence upon the relationship in magnitude between the input voltages applied to the input terminals 100 and 200. When the potential level at the input terminal 100 is higher than that of the input terminal 200, collector current of the transistor 10 will be increased. Consequently, the collector current of the transistor 20 must be decreased and will flow to the amplifier 4, resulting in the logic "1" at the output of the amplifier 4. On the contrary, when the potential at the input terminal 100 is lower than that of the input terminal 200, the comparator circuit operates in the reverse manner to output logic "0" through the amplifier 4.

parators which are employed when characteristics between the input and the output signals, such as illustrated in FIGS. 3a to 3c, are to be attained. In the case of the comparator arrangement shown in FIG. 2a, a signal from a signal source 101 is applied in common to the input terminals 100-1 and 100-2 of two comparators 5-1 and 5-2, while the other input terminals 200-1 and 200-2 of the comparators 5-1 and 5-2 are supplied with signals of predetermined amplitudes from signal sources 201 and 202.

With the input voltage from the signal source 101 represented by $e_S$ and the signal voltages from the signal sources 201 and 202 represented by $e_U$ and $e_L$, respectively, it is assumed that $e_U > e_L$. Further, it is assumed that each of the comparators has such characteristics that logic "1" is produced at the output when the upper input terminal 100-1 or 100-2 reaches a higher potential than that of the lower input terminal 200-1 or 200-2 and logic "0" is produced when the input conditons are inverted.

If the input signal $e_S$ is lower than $e_L$ or $e_S < e_L$, then the signal $e_S$ will become lower than $e_U$, namely $e_S < e_U$ from the assumption that $e_L < e_U$. The outputs from both of the comparators 5-1 and 5-2 are both logic "0's." On the other hand, if the input signal $e_S$ is in the range of the signal levels between $e_L$ and $e_U$, i.e. $e_L > e_S < e_U$, the output from the comparator 5-1 is logic "1," while the output from the comparator 5-2 is logic "0." Under the condition that $e_U < e_S$, then $e_L < e_S$ from the assumption that $e_U > e_L$. This means that both outputs from the comparators 5-1 and 5-2 will become logic "1's." Thus, it will be understood that, when a sensor is employed as the signal source 101 and the output from the sensor as represented by $e_S$ is applied to the input terminals 100-1 and 100-2, the characteristics of the control output signal, such as shown in FIG. 3a or 3b, can be easily obtained by merely providing a simple logic circuit 50.

These characteristics are often utilized in an apparatus for determining whether an input signal is in a predetermined range or not. In such case, two comparators have to be used, as will be apparent from the foregoing description.

The circuit shown in FIG. 2b is so arranged as to obtain a so-called hysteresis characteristic. Operation of this circuit is conducted in a substantially similar manner as described above. In brief, the output signal from the comparator 5-1 functions to set or reset a flip-flop of the logic circuit 50, while the output from the comparator 5-2 is used to reset or set the flip-flop of the logic circuit 50, whereby the characteristic, such as shown in FIG. 3c, can be obtained. Such operating characteristic is essential for on-off or switching control elements employed widely in various practical applications.

In the case where a single comparator has to deal with two or more signals, it will be contemplated that the input signal sources 101 and 102 are alternatively connected to the comparator 5 with the aid of a change-over switch 90, as is shown in FIG. 4. In such case, since the output signal 101 or 102 is often at low level, as in the case of a sensor output signal, it is required to use a change-over switch with a high precision in order to assure a desired reliability. In practice, the switch 90 shown symbolically in FIG. 4 is constituted by a transistor or the like circuit. In order to meet the high accuracy or reliability requirement described above, the practical switching circuit will become necessarily very expensive to cancel out advantages obtained by using the single comparator.

As will be appreciated from the above description, an increased number of comparators, as well as a circuit of enlarged scale, are necessarily accompanied by correspondingly increased expenditure. Thus, in the conventional control circuit which requires usually a plurality of sensors, an the increased number of comparators required will involve a serious problem in practice. Particularly, implementation of such a control circuit as an integrated circuit is subjected to severe restriction in respect of the circuit scale from the economical viewpoint, which has hitherto provided obstacles in practicality particularly in the control system including a large number of sensors.

SUMMARY OF THE INVENTION

Accordingly, an object of the invention is to provide a comparator circuit which is free from drawnbacks and disadvantages of the hitherto known circuit as described above.

Another object of the invention is to provide a comparator circuit which is capable of being implemented in an integrated circuit configuration in a reasonable size.

Still another object of the invention is to provide a comparator circuit which can be manufactured inexpensively.

In view of the above and other objects which will become more apparent as description proceeds, there is provided according to an aspect of the invention a comparator circuit comprising first and second transistors connected in a differential circuit configuration and adapted to be controlled by first and second input signals, respectively, a third transistor connected in parallel to the first and second transistors and adapted to be controlled by a third input signal, and means for applying a control signal to the input electrode side of the third transistor to cause the latter to become non-conductive.

DESCRIPTION OF THE REFERRED EMBODIMENTS

Figure 1:
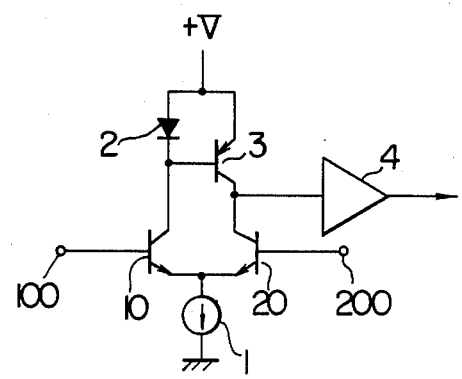
FIG. 1 is a circuit diagram showing a hitherto known differential input circuit stage of a conventional comparator.
Figure 5:
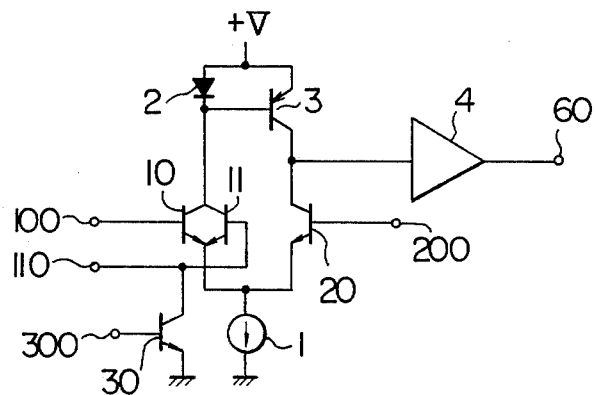
FIG. 5 is a circuit diagram showing a fundamental circuit arrangement of an input stage for a comparator in accordance with an embodiment of the invention.

FIG. 5 shows an exemplary embodiment of a fundamental circuit arrangement according to the invention. As compared with the circuit described hereinbefore in conjunction with FIG. 1, the circuit shown in FIG. 5 is different from the former in that transistors 11 and 30 are additionally provided in association with correspondingly added input terminals 110 and 300. The remaining portion of the circuit arrangement shown in FIG. 5 is substantially the same as the one shown in FIG. 1.

Referring to FIG. 5, the transistor 11 has an emitter and a collector connected, respectively, to the emitter and collector of the transistor 10. A transistor 30 is connected so as to serve as a switch for grounding the base of the transistor 11 under the control of a signal applied to the terminal 300. The other elements function in the same manner as those shown in FIG. 1.

Describing operations of the circuit shown in FIG. 5, it is assumed that an input signal is applied to the input terminal 300 to make the transistor 30 conductive or "ON." Then, the transistor 11 has its base grounded through the conducting transistor 30 to become non-conductive or "OFF." Under these conditions, the circuit shown in FIG. 5 will operate in dependence upon relationships in level between the signals applied to the input terminals 100 and 200.

Figure 2A:
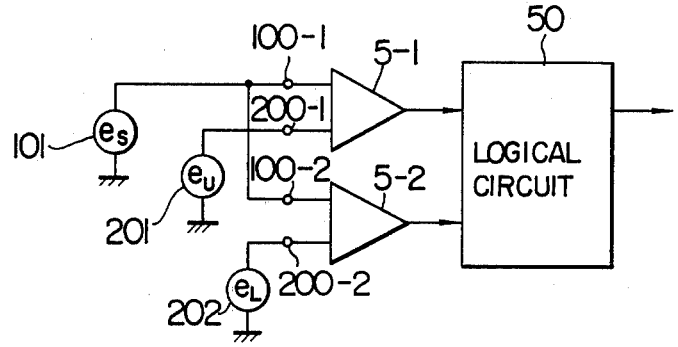
FIG. 2a is a block diagram of a control circuit arrangement constituted by hitherto known comparators.
Figure 2B:
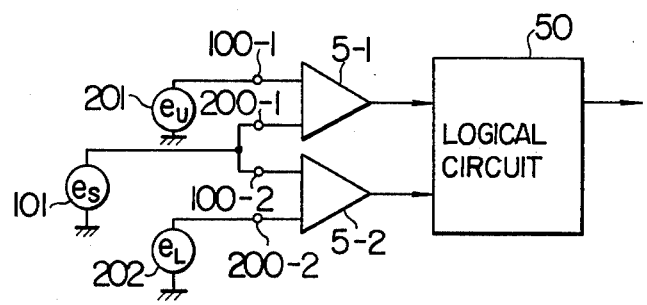
FIG. 2b is a block diagram of another control circuit arrangement constituted by hitherto known comparators.

Next, assuming that the potential level at the input terminal 300 becomes lower to cause the transistor 30 to be non-conductive, the output condition or level of the comparator is determined by the combination of the signal having the higher potential of those applied to the input terminals 100 and 110 and the potential at the input terminal 200. In other words, the transistor having a lower base potential among the transistors 10 and 11 takes substantially no part in the circuit operation, as a result of which the differential operation is carried out between the transistor 20 and one of the transistors 10 and 11 having a higher base potential. In this manner, it is possible to select definitely or exchangeably one input signal from those applied to the terminals 100 and 110 to be compared with the input signal applied to the input terminal 200 in the circuit configuration shown in FIG. 5. Accordingly, any one of the characteristics shown in FIGS. 3a to 3c can be obtained in the circuit shown in FIG. 5 which thus performs apparently functions of the two comparators shown in FIG. 2a or 2b.

Figure 3A:
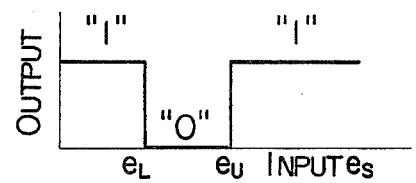
FIGS. 3a to 3c graphically illustrate relationships between input and output signals as required in certain control apparatus or the like, respectively.
Figure 3B:
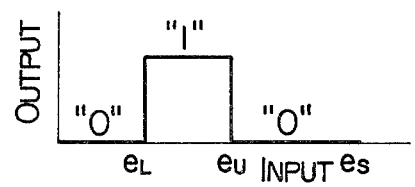

In other words, the characteristics illustrated in FIG. 3a or 3b can be attained in the output signal at the output terminal 60 of the amplifier 4 of the circuit shown in FIG. 5 when the base potential of the transistor 30 (i.e. the input signal applied to the input terminal 300) is varied so as to become be provided at high and low voltage levels.

In more detail, it is assumed that the signals $e_S$, $e_L$ and $e_U$ shown in FIGS. 3a and 3b are applied to the input terminals 200, 100 and 110, respectively, of the circuit shown in FIG. 5:

(1) When $e_S < e_L$, the output at the terminal 60 is logic "1" regardless of whether the input voltage at the input terminal 300 is low or high.

(2) In the case where $e_L \leq e_S < e_U$, the output appearing at the terminal 60 is logic "0" when the input voltage at the input terminal 300 is high, while the output 60 becomes logic "1" when the input voltage at the terminal 300 is low.

(3) In the case where $e_U \leq e_S$, the output at the terminal 60 is logic "0" regardless of whether the input voltage at the terminal 300 is high or low.

In this manner, it is possible to determine the relationships between the signals $e_S$ and $e_L$ or $e_U$ in respect of magnitudes thereof by detecting which condition among those (1), (2) and (3) described above the output signal at the terminal 60 meets when two input voltages of low and high levels are applied to the input terminal 300.

As described hereinbefore, the transistors 11 and 30 are indispensably required for the circuit shown in FIG. 5. It should be however noted that addition of these transistors involves only a negligible increase in the required space upon implementing the circuit in an integrated form. The area of a substrate for integrating the circuit shown in FIG. 1 will be substantially sufficient for implementing the circuit of FIG. 5 in the integrated configuration. In other words, the circuit arrangement shown in FIG. 5 permits the function corresponding to that of the two combined comparators to be performed without requiring any appreciable increase in the integration area for one comparator.

In order that the circuit shown in FIG. 5 can operate in the manner described above, it is necessary that the above mentioned relations among three input signals should satisfy the conditions (1), (2) and (3) in respect of the voltage levels with offset values of the individual elements being also taken into consideration. This can be accomplished easily in practice, as will be understood from the following description.

In most cases of usual applications of the comparators, the input voltages to the comparator are set in the range of 30 to 70% and preferably around a half (50%) of the source voltage. For example, the input voltage is usually in the range of one to several volts. On the other hand, the offset value is on the order of several millivolts and at highest rarely exceeds several hundred millivolts. In this way, it is easy to limit the total offset value in a range lower than one volt without resorting to the use of specifically designed elements. This means that the above described conditions are always satisfied in the usual applications.

Next, description will be made of the accuracy or the reliability at which the circuit shown in FIG. 5 can be operated. According to the invention, there are provided additionally to the fundamental differential circuit an input transistor (the transistor 11 in FIG. 5) and a control transistor therefor (the transistor 30 in FIG. 5). However, the addition of the transistor will exert substantially no influence on the accuracy at which the circuit can be operated as a comparator. When an offset voltage is possibly produced in the conductive state of the switching transistor 30, the magnitude thereof is usually much lower than the operation voltage level of the comparator, i.e. the input voltage level at the input terminal 100 of the transistor 10. Further, the possibly produced offset current in the "OFF" or non-conducting state of the switching transistor will remain at a very low level. Thus, the voltage determined by such offset current and the resistor connected to the input terminal 110 can be made sufficiently lower than 1 mV, when the resistor is selected at a value lower than 100 KΩ. In this manner, the circuit arrangement according to the teachings of the invention will never increase the offset voltage (usually on the order of several millivolts) appearing in the intrinsic comparator circuit.

As will be appreciated from the foregoing discussion, the circuit shown in FIG. 5 constructed according to the teachings of the invention can be operated in a similar manner as the comparator in an intrinsic sense without any adverse influence on the accuracy required for the comparator and at the same time enjoy multi-functions attainable through combinations of two or more hitherto known comparators.

In the following, description will be made of some modifications of the fundamental circuit arrangement shown in FIG. 5 as well as applications in which the characteristics thereof are utilized.

Figure 6:
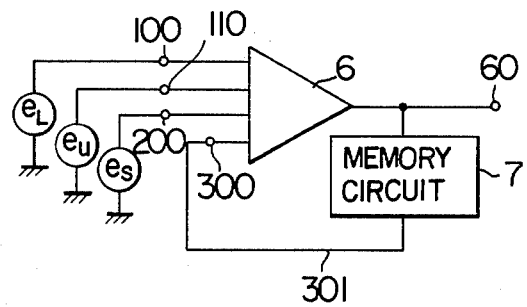
FIG. 6 shows schematically an exemplary embodiment of a control circuit arranged to obtain the characteristics shown in FIG. 3c.

FIG. 6 shows a circuit apparatus which is so arranged as to make use of the characteristics of the fundamental circuit shown in FIG. 5 which circuit is generally denoted by reference numeral 6 in FIG. 6.

Input voltages $e_L$ and $e_U$ are applied to the input terminals 100 and 110, respectively, while a signal voltage $e_S$ is applied to the input terminal 200. A feedback loop including a memory circuit 7 is provided for the circuit 6. The memory circuit 7 may be constituted by flip-flops or any other suitable elements so far as the positive feedback is assured for the output 60.

In the circuit shown in FIG. 6, it is assumed that the circuit arrangement is designed so as to turn off the transistor 30 when the output 60 from the circuit 6 is logic "0" and to produce a logic "1" output signal of the circuit 6 when the input signal $e_S$ is higher than the signal $e_U$ or $e_L$.

Figure 3C:
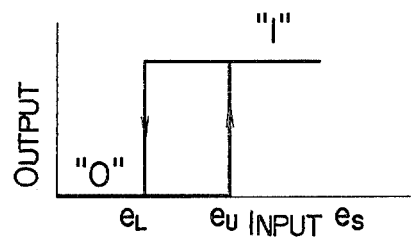

Assuming that $e_L < e_U$, the output from the circuit 6 is logic "0" and the transistor 30 is non-conductive if $e_S < e_L$. On the other hand, if $e_S > e_U$, then the output from the circuit 6 is logic "1" with the transistor 30 turned on (or conductive). However, in the case where $e_L < e_S < e_U$, the output status can not be definitely established but will exhibit a hysteresis characteristic such as shown in FIG. 3c in dependence on variation of the signal $e_S$. In this manner, when a sensor output is used as the input signal $e_S$ with the other signals $e_U$ and $e_L$ being preset voltages, the switching point at which the state of the circuit 6 is changed over as well as the width of the hysteresis can be established or made variable in an arbitrary manner with a high accuracy.

Figure 7:
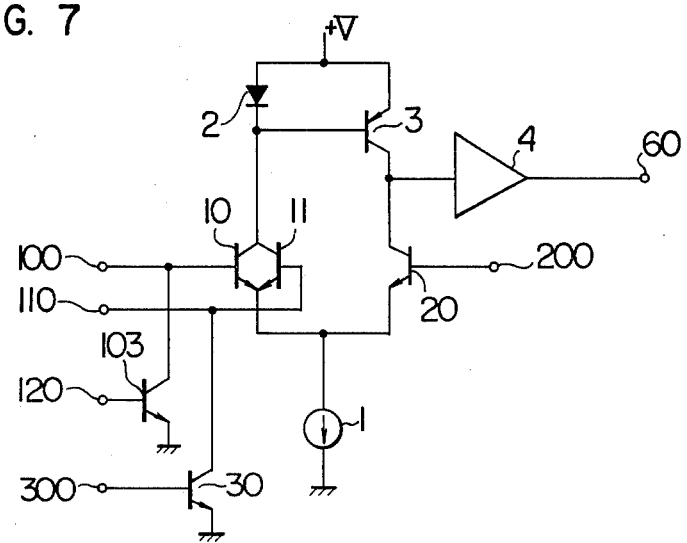
FIG. 7 is a circuit diagram showing an exemplary embodiment of a comparator according to the teachings of the invention.

FIG. 7 shows a circuit arrangement which corresponds to the circuit shown in FIG. 5 except for a switching transistor 103 provided for the input transistor 10. By controlling the switching transistors 30 and 103 in respect of the switching operation through the output signal 60 or external signals, the logic status of the output signal 60 can be determined by an increased number of factors, thereby to allow a multi-function control circuit to be accomplished with a high accuracy.

Figure 4:
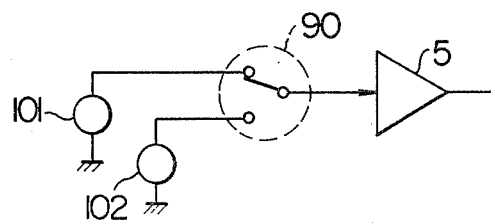
FIG. 4 is a block diagram of a circuit arrangement in which a single comparator is used exchangeably for a plurality of input signals.

For example, in the circuit shown in FIG. 7, because the detection signals from two sensors can be selectively or alternatively applied to the input transistors 10 and 11 by on-off control of the switching transistors 103 and 30 for comparison with the preset voltage, the circuit shown in FIG. 4 can be formed in a simplified manner.

Figure 8:
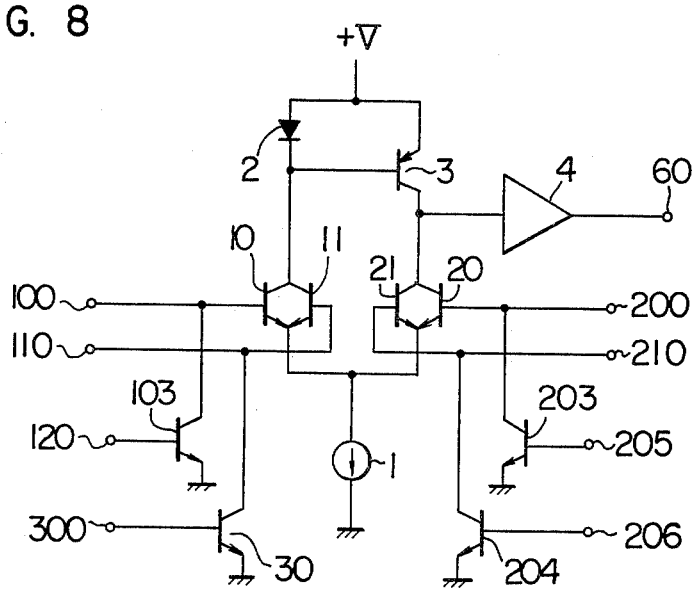
FIG. 8 is a circuit diagram showing another comparator according to an embodiment of the invention.

FIG. 8 shows a modified circuit developed from the circuit arrangement shown in FIG. 7. It will be seen that the circuitry including the counterpart transistor 20 is made symmetrical to the transistor circuitry 10 through addition of an input transistor 21 having an input terminal 210 and of switching transistors 203 and 204 having respective input terminals 205 and 206. According to this circuit arrangement, it is possible to obtain a more complicated multi-function control circuit with a high accuracy or reliability. For example, four input signals A, B, C and D as applied to the input terminals 100, 110, 200 and 210 may be divided into two signal groups (A, B) and (C, D), thereby to make comparison between two signals each arbitrarily selected from these signal sets. Of course, it is possible to change or modify the combinations of the input signals.

Figure 9:
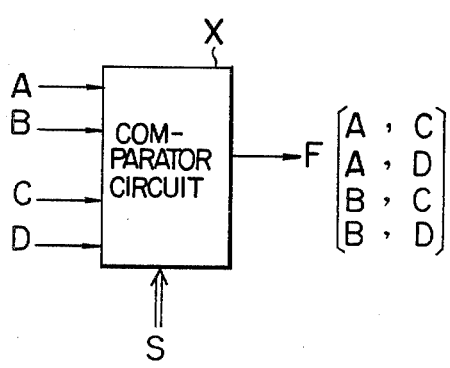
FIG. 9 is a schematic diagram to illustrate operation of the comparator circuit shown in FIG. 8.

FIG. 9 illustrates the functions of the circuit shown in FIG. 8 by way of an example where two reference levels are required for each of the detection signals from sensors. For the input signals A, B, C and D, the output signal F is determined in dependence of the relationship between two inputs in forms of combinations of (A, C), (A, D), (B, C) and (B, D) as well as hysteresises of variations in the input signal. Symbol S represents control signals applied to the input terminals 120, 300, 205 and 206 of the switching transistors 103, 30, 203 and 204.

Figure 10:
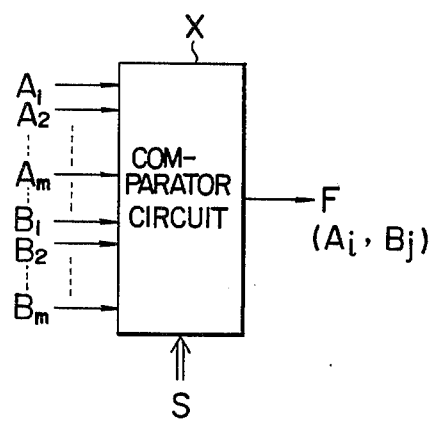
FIG. 10 illustrates in general functions or operations of a comparator circuit constructed in accordance with the teachings of the invention.

It will be easily understood from the illustration shown in FIG. 9 that the circuit arrangement according to the invention can be expanded to such an arrangement as illustrated functionally in FIG. 10. There are m inputs $A_1, A_2, \ldots, A_m$ and n inputs $B_1, B_2, \ldots, B_n$. The output F of the comparator circuit X is determined in dependence on the relationships between the inputs ($A_i$, $B_j$) in respect of the magnitudes thereof as well as variations or hysteresises thereof. A practical circuit arrangement for performing the functions illustrated in FIG. 10 may include m first transistors corresponding to the inputs $A_i$, m switching transistors connected, respectively, between the bases of the first transistors and ground, n second transistors corresponding to the inputs $B_j$ and n switching transistors connected, respectively, between the bases of the second transistors and ground. The first transistors have their collectors connected to one another and have their emitters connected to one another, and the second transistors have their collectors connected to one another and have their emitters connected to one another, so that the m first transistors as well as the associated switching transistors provided on the A-input side are connected to the n second transistors as well as the associated switching transistors on the B-input side in the differential circuit configuration. The connection to the load circuits is made in the substantially same manner as the one shown in FIG. 8, detailed description of which will therefore be unnecessary.

With such circuit arrangement, the operation under the condition m=3 (namely, $A_1$, $A_2$ and $A_3$) and n=1 (namely $B_1$) may be performed in the following manner. A measurement input signal $e_S$ is applied to the input $B_1$, while reference voltages $e_1$, $e_2$ and $e_3$ of different levels are applied to the inputs $A_1$, $A_2$ and $A_3$. When switching signals from a counter circuit are sequentially applied as the control signal to the switching transistors corresponding to the inputs $A_1$, $A_2$ and $A_3$, thereby to turn on the switching transistors, then the input voltage $e_S$ is sequentially compared with the reference voltages $e_1$, $e_2$ and $e_3$, as a result of which the output state F is determined. It is thus possible to detect the relationships in magnitude between $e_S$ and $e_1$, $e_2$ and $e_3$ from the output F and the control signal S. This means that an analogue-to-digital conversion is effected.

On the contrary, when the reference voltages $e_1$, $e_2$ and $e_3$ are applied to the inputs $B_1$, $B_2$ and $B_3$ with different measurement signals being applied to the inputs $A_1$, $A_2$ and $A_3$, while the on-off control of the switching transistor is effected through the control signals S, the changing-over of multi-input signals, namely, a multiplexing function can be attained.

It will thus be appreciated that a single circuit constructed according to the teachings of the invention allows many functions or composite functions to be performed. Typical examples of the functions attainable in the circuit according to the invention may be enumerated as follows:

(1) One input signal having the highest voltage level amont two or more input signals can be automatically selected and compared with a reference voltage (function of a comparator).

(2) Hysteresis characteristics can be obtained in which points of variation and width of hysteresis loop can be set in an arbitrary manner.

(3) Two or more signals can be exchangeable compared with a reference signal (function of a comparator with a multiplexer).

(4) Two or more reference signals can be employed for comparison with a single input signal (function of a multi-level converter or analogue-to-digital converter).

(5) Two or more functions among the above described functions can be combined in a selective manner, whereby a multi-function circuit is obtained which can be easily adopted for various purposes or desired applications.

One of the most important advantages obtained in the circuit according to the invention resides in the fact that the circuit exhibiting many functions described above can be implemented as an integrated circuit in an extremely small area without requiring any specific elements and conditions. Thus, a multi-function circuit can be implemented inexpensively. This can be explained by the following fact; namely, as described hereinbefore in conjunction with FIGS. 5, 7 and 8, the circuit arrangement according to the invention can be constituted merely by adding a combined circuit including input transistors and switching transistors to the differential input stage of a comparator with the remaining portions of the comparator remaining unchanged. When the inventive circuit is to be integrated, the ratio of area for the input stage relative to the area for the whole circuit will not amount to more than 10%. Namely, the increase in area for the integrated circuit due to the addition of the input and the switching transistors can be retained at a negligible value.

Figure 11A:
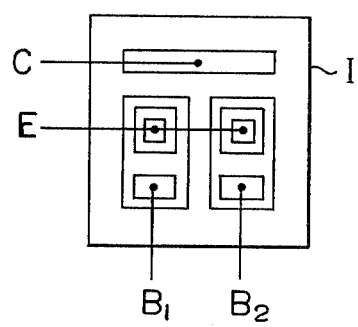
FIG. 11a and 11b illustrate schematically manners for implementing comparators in integrated circuits according to the invention.
Figure 11B:
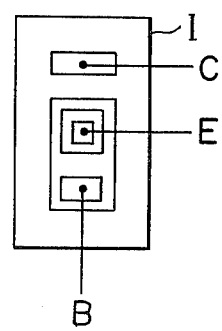

Besides, the following advantages can be attained in the integrated circuit. Referring again to FIG. 5, the input transistor 11 and the switching transistor 10 additionally provided according to the teachings of the invention have their respective emitters and collectors connected to each other. Accordingly, when the whole circuit is to be implemented in a standard bipolar circuit, for example, two transistors will be formed in a single isolated region I as shown in FIG. 11a. In this case, the occupation area for each of the transistors is reduced to 80% of the area for a transistor which is formed singly in the corresponding isolated region as illustrated in FIG. 11b. It will be readily understood that transistors having collectors connected in common relative to one another can be formed in a common isolated region and thus the occupation area for each such transistor can be more greatly decreased as the number of transistors is increased. In FIGS. 11a and 11b, reference characters C, E and B denote a collector, an emitter and a base, respectively.

Figure 12:
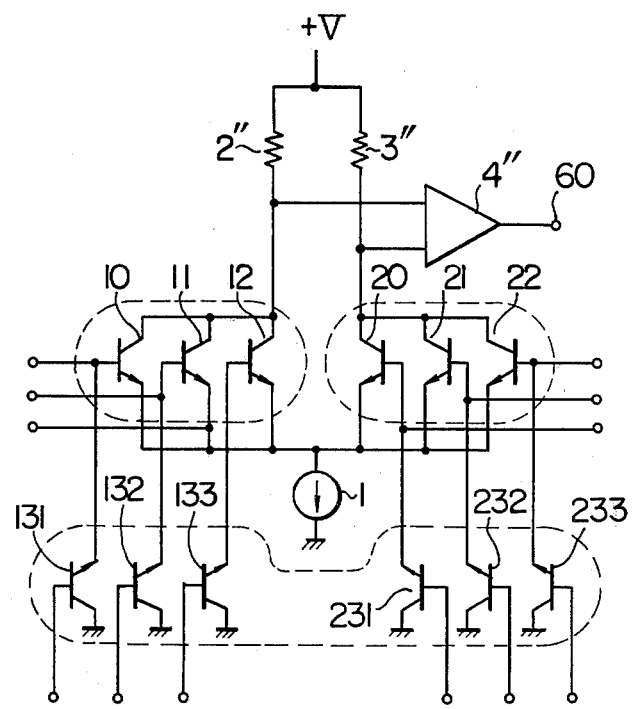
FIG. 12 is a circuit diagram showing another embodiment of the comparator circuit according to the invention.

When the switching transistors 131 to 133 and 231 to 233 are implemented with the respective emitters and collectors connected in the reversed manner to the connection shown in FIG. 8, as is illustrated in FIG. 12, the collectors of all the switching transistors can be grounded in common. Thus, these switching transistors can be formed in a common isolated region. In FIG. 12, transistors shown as enclosed by broken lines can be formed in the respective common isolated regions. Furthermore, output signals from the load resistors 2" and 3" are differentially applied to the output amplifier 4".

Figure 13:
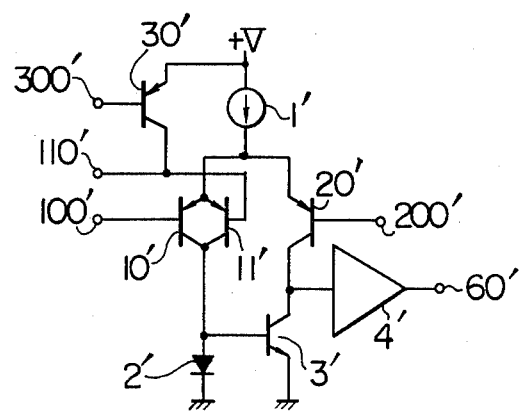
FIG. 13 is a circuit diagram showing still another embodiment of the comparator circuit according to the invention, in which the differential input stage of the comparator is constituted by PNP-type transistors.

In the foregoing description, it has been assumed that NPN-type transistor is used for the differential input stage. However, it will be appreciated that PNP-type transistors can be employed to the same effect. FIG. 13 shows a circuit similar to the one shown in FIG. 5 except that the corresponding transistors 10', 11' and 20' are of PNP-type. Since no specific requirements are imposed on the succeeding amplifier stage 4' as well as load elements 2' and 3', these circuits may be realized in various configurations. Further, it will be appreciated from the foregoing description concerning the circuit operations that the collectors of the input tansistors need not be necessarily connected in common. The location of the terminals for leading out the output signal is not restricted to those shown in the drawing but can be provided at any appropriate portions.

The invention has now provided a control circuit which can be economically fabricated in a form of integrated circuits of simplified configurations without increasing circuit dimensions and exhibit many functions as required for various control apparatus.

I claim:

1. A comparator circuit comprising:
   first and second transistors having respective input electrodes for receiving first and second input signals, respectively;
   a third transistor having an input electrode for receiving a third input signal to be compared with said first and second input signals;
   input means connected to the respective input electrodes of said first, second and third transistors for supplying said first, second and third input signals;
   a current source connected in common to said first output electrodes of said first, second and third transistors;
   a first control means connected to the input electrode of said first transistor and responsive to a control signal for selectively rendering said first transistor non-conductive independent of said first input signal;
   potential source means connected to second output electrodes of said first, second and third transistors; and
   output means connected to the second output electrode of at least one of said first, second and third transistors.

2. A comparator circuit as set forth in claim 1, wherein said first control means comprises a switching means for selectively supplying a potential for making said first transistor non-conductive.

3. A comparator circuit as set forth in claim 2, wherein said switching means comprises a fourth transistor having an input electrode for receiving said control signal in the form of a fourth input signal.

4. A comparator circuit as set forth in claim 1, further including load means connected between second output electrodes of said first, second and third transistors and said potential source means.

5. A comparator circuit as set forth in claim 1, wherein said output means is connected to the second output electrode of said third transistor.

6. A comparator circuit as set forth in claim 4, wherein the second output electrodes of said first and second transistors are connected in common and said load means comprises a first load element connected between the common connection of the second output electrodes of said first and second transistors and said potential source means, and a second load element connected between the second output electrode of said third transistor and said potential source means.

7. A comparator circuit as set forth in claim 1, further comprising second control means connected to the input electrode of said second transistor and responsive to a second control signal for making said second transistor non-conductive independent of said second input signal.

8. A comparator circuit as set forth in claim 7, wherein said second control means comprise a switching means for selectively supplying a potential for making said second transistor non-conductive.

9. A comparator circuit as set forth in claim 1, further including feedback means for feeding the output signal from said output means back to said first control means.

10. A comparator circuit as set forth in claim 7, further including a fourth transistor having an input electrode for receiving a fourth input signal to be compared with said first and second input signals, a fourth control means connected to the input electrode of said fourth transistor and responsive to a fourth control signal for making said fourth transistor non-conductive, and a third control means connected to the input electrode of said third transistor and responsive to a third control signal for making said third transistor non-conductive.

11. A comparator circuit as set forth in claim 10, said first, second, third and fourth control means comprise, respectively, switching means for selectively supplying potentials for making non-conductive the associated first, second, third and fourth transistors.

12. A comparator circuit as set forth in claim 1, wherein said first and second input signals are reference signals having a high level and a low level, respectively.

13. A comparator circuit as set forth in claim 12, wherein said output means is connected to the second output electrode of said third transistor.

* * * * *